(12) United States Patent
Doescher

(10) Patent No.: US 7,253,532 B2
(45) Date of Patent: Aug. 7, 2007

(54) ELECTRICAL OR ELECTRONIC COMPONENT AND METHOD OF PRODUCING SAME

(75) Inventor: Michael Doescher, Hamburg (DE)

(73) Assignee: NXP B.V., Eindhoven (NL)

( * ) Notice: Subject to any disclaimer, the term of this patent is extended or adjusted under 35 U.S.C. 154(b) by 35 days.

(21) Appl. No.: 11/351,746

(22) Filed: Feb. 10, 2006

(65) Prior Publication Data

US 2006/0128062 A1 Jun. 15, 2006

Related U.S. Application Data

(62) Division of application No. 10/492,120, filed as application No. PCT/IB02/04130 on Oct. 9, 2002, now Pat. No. 7,029,948.

(30) Foreign Application Priority Data

Oct. 9, 2001 (DE) .............................. 101 49 689

(51) Int. Cl.
  *H01L 23/29* (2006.01)
  *H01L 21/44* (2006.01)
(52) U.S. Cl. ..................................... 257/790; 438/112
(58) Field of Classification Search ........ 438/110–114, 438/460–465; 257/678, 687, 787, 795
See application file for complete search history.

(56) References Cited

U.S. PATENT DOCUMENTS

| 2004/0147064 A1* | 7/2004 | He ............................. 438/127 |
| 2005/0156309 A1* | 7/2005 | Fujii et al. .................. 257/702 |
| 2005/0277231 A1* | 12/2005 | Hembree et al. ........... 438/127 |

* cited by examiner

*Primary Examiner*—Calvin Lee
(74) *Attorney, Agent, or Firm*—Peter Zawilski

(57) ABSTRACT

To refine an electrical or electronic component having at least one discrete or integrated device formed from a wafer, in plate or disk form, of semiconductive or insulating material, the front face of which device has at least one protruding electrode and is encapsulated by at least one front-face encapsulant, the side faces of which device are at least partly encapsulated by at least one side-face encapsulant, and the rear face of which device is encapsulated by at least one rear-face encapsulant, and to refine a method of producing the same, in such a way that, with the aim of widening the possible uses and applications, electrical contact is made not solely with the front face of the device that is to be housed in the plastics package of very small dimensions, it is proposed that both the side-face encapsulant and the rear-face encapsulant be formed at least partly of layers, but with the layers connected, of electrically conductive material.

5 Claims, 16 Drawing Sheets

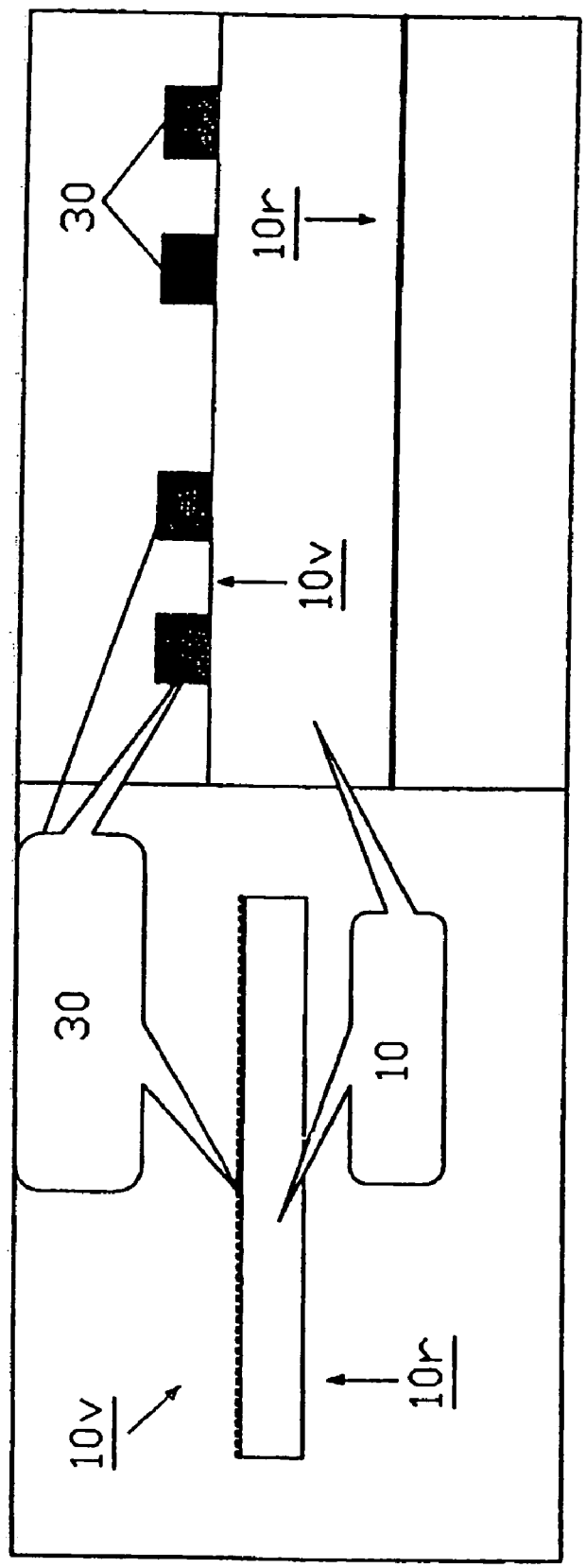

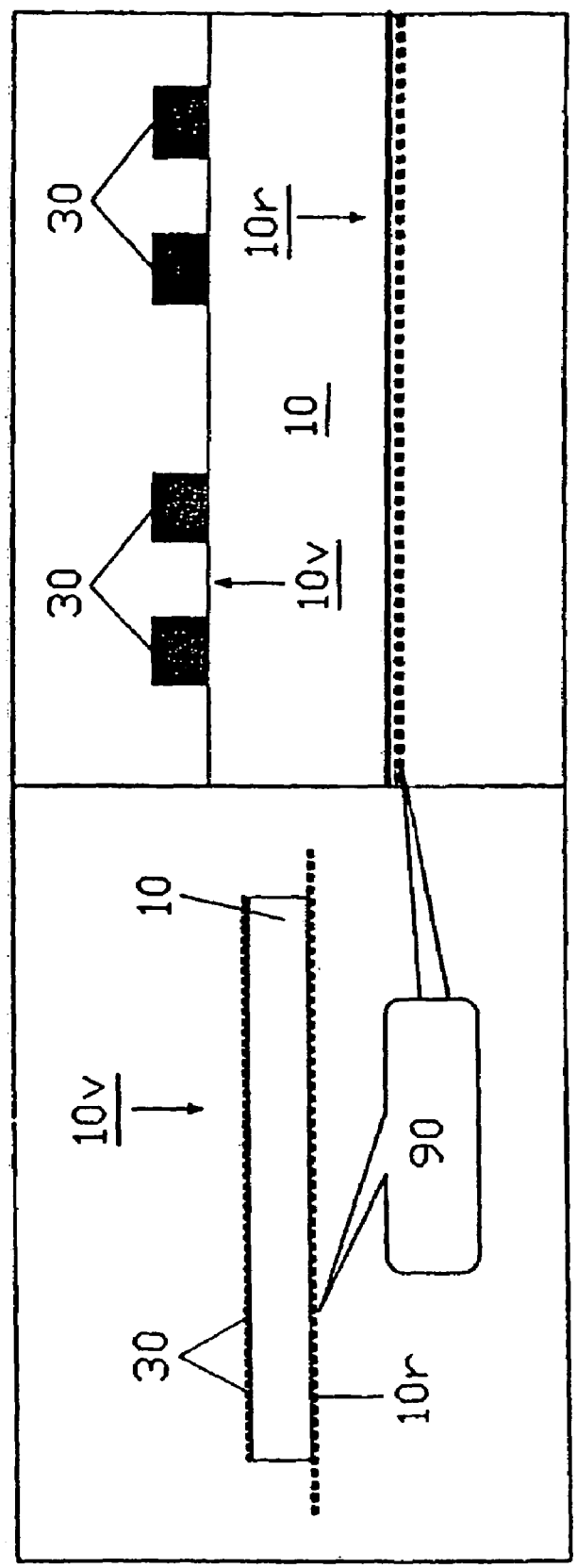

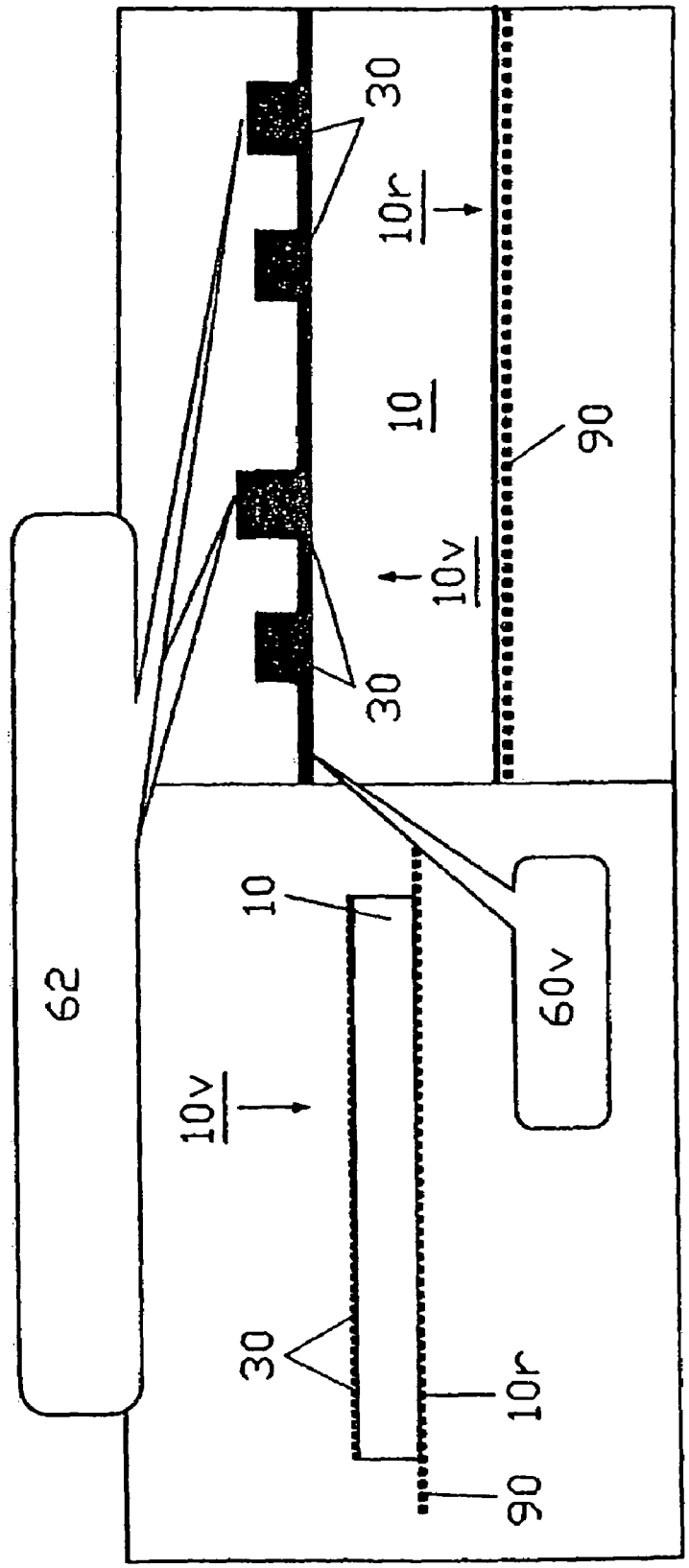

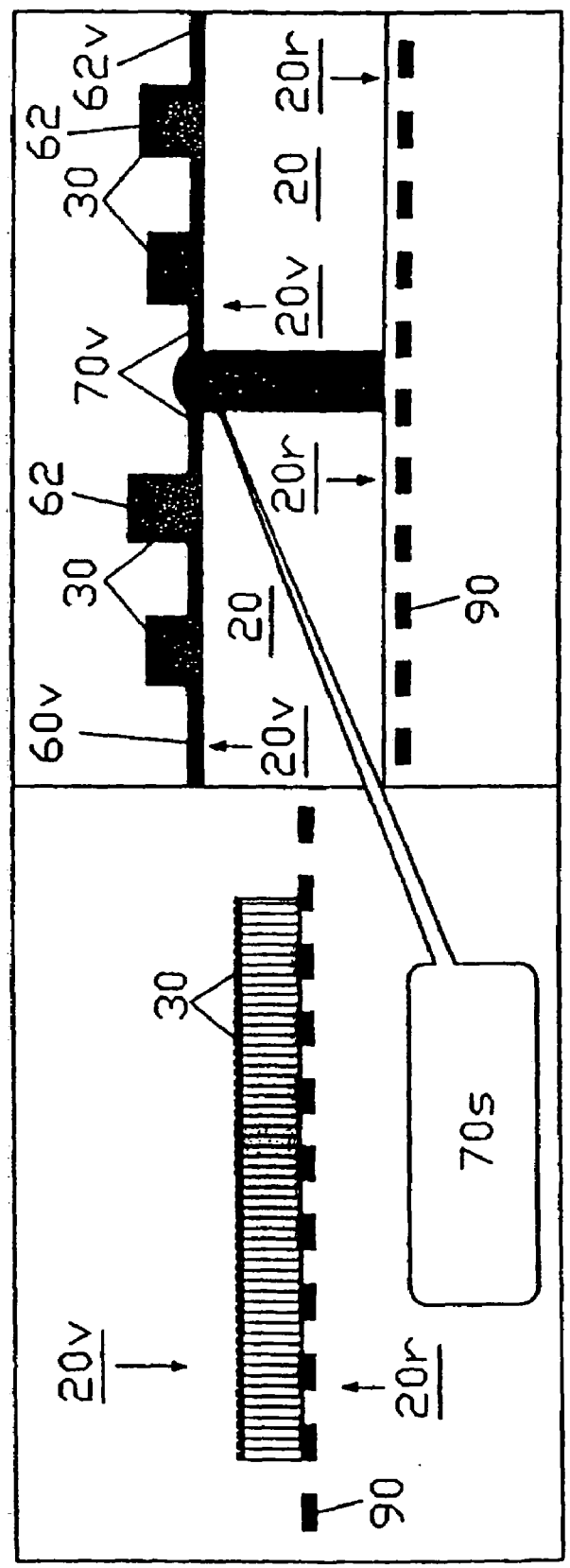

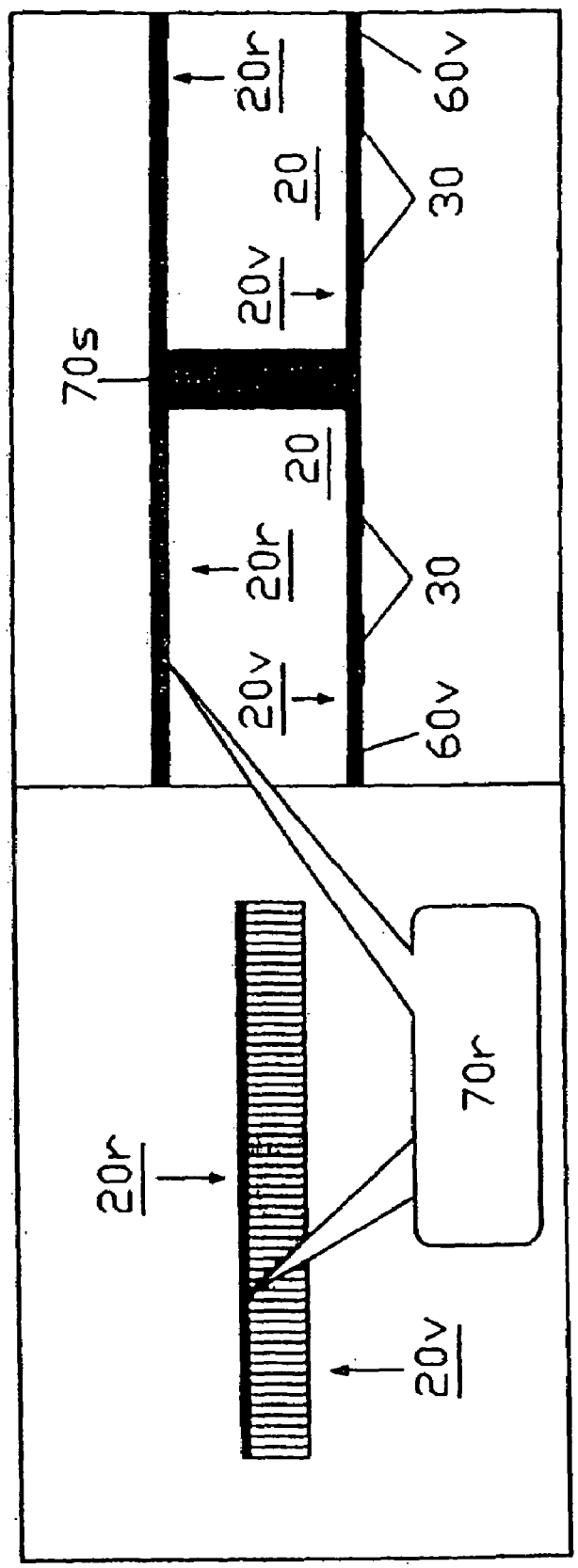

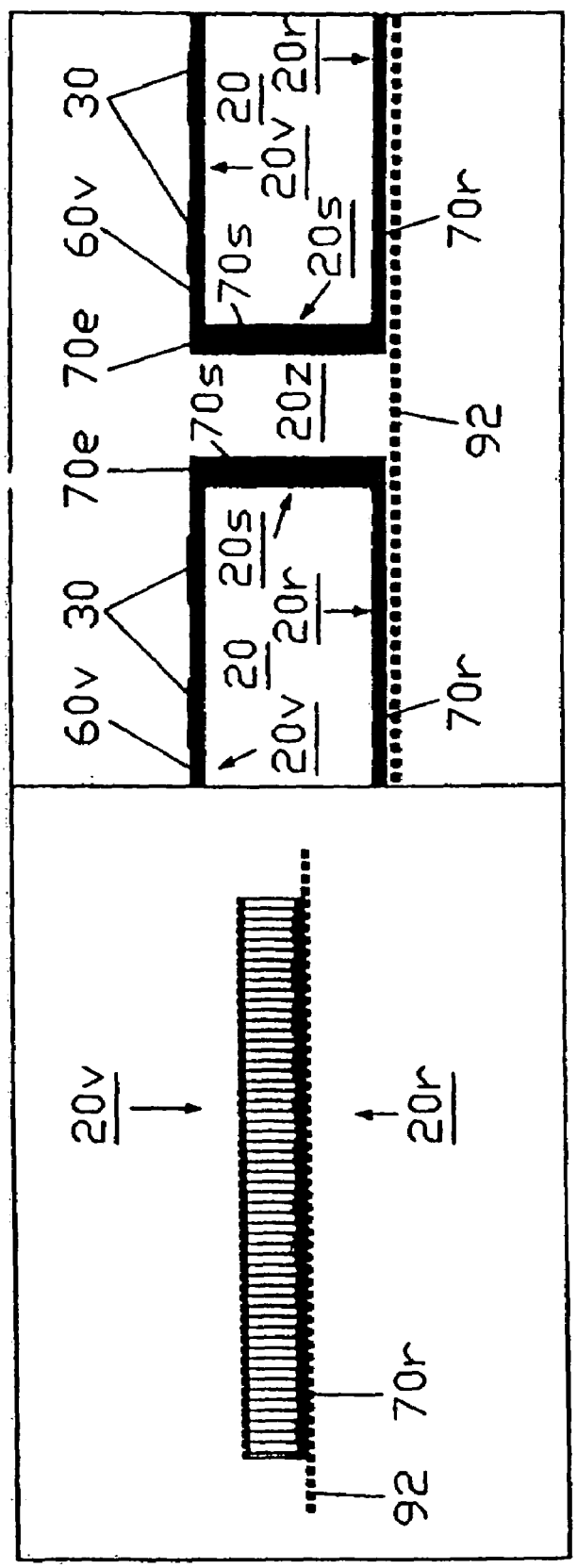

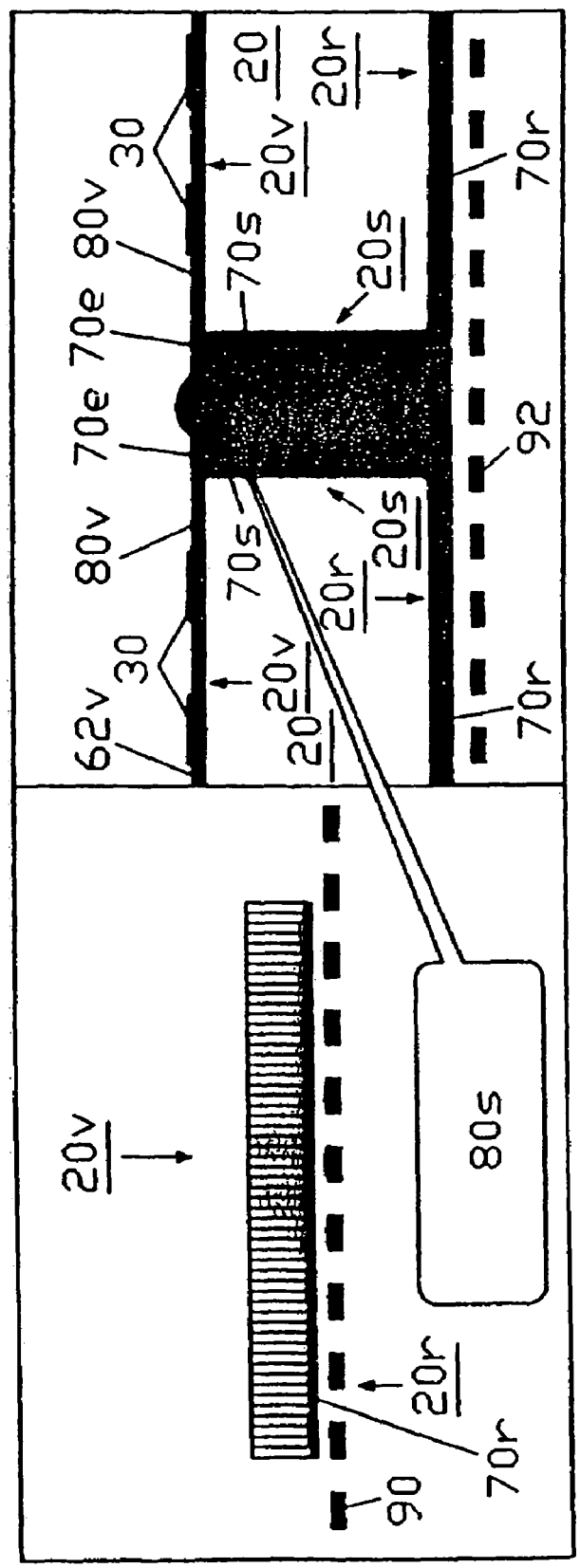

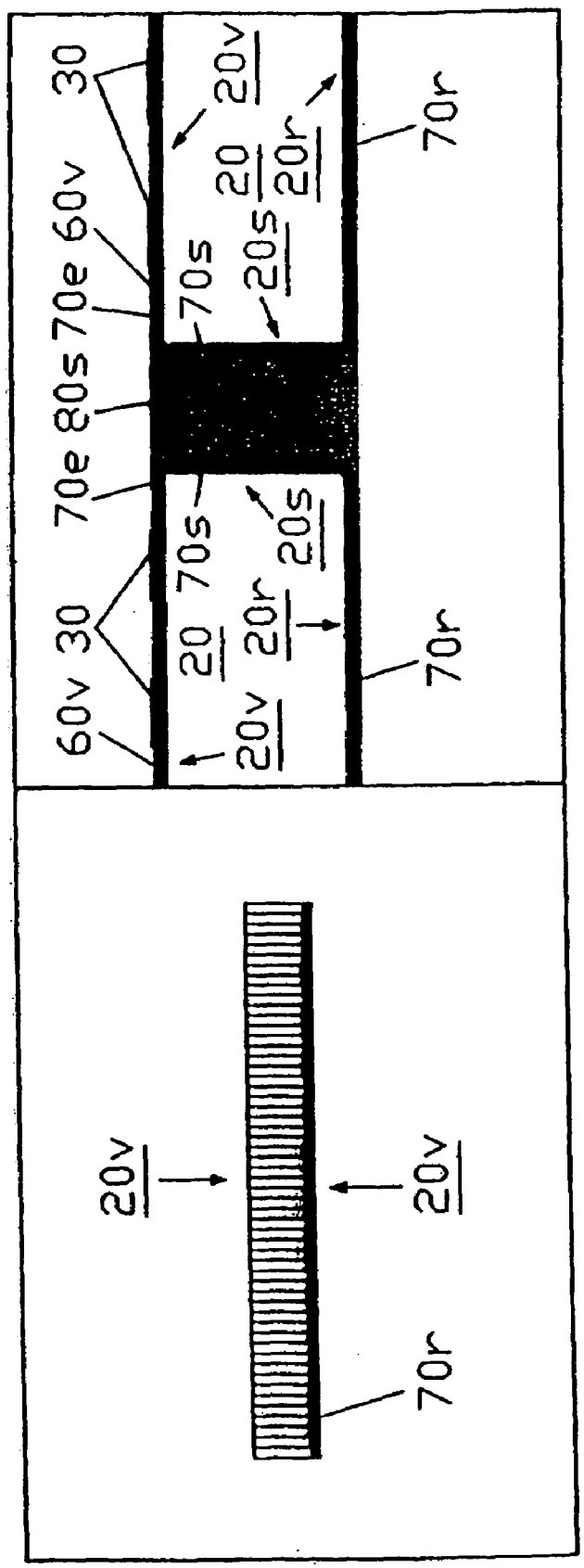

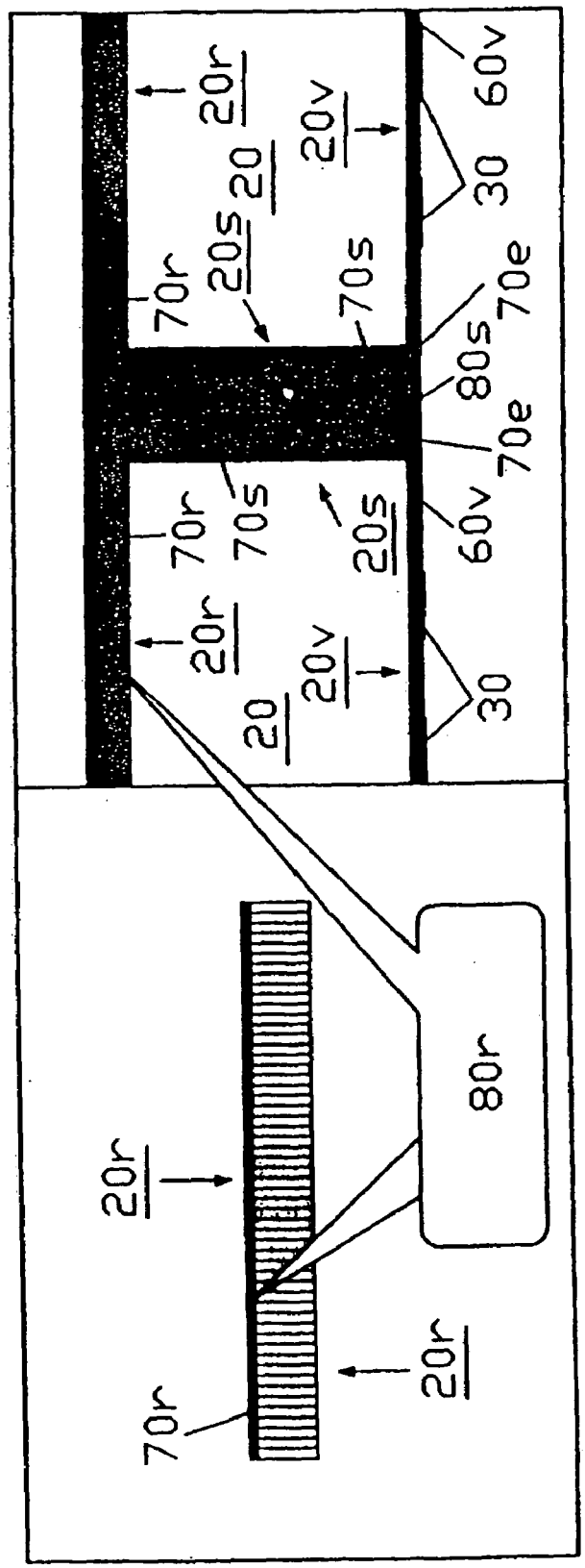

ELECTRICAL OR ELECTRONIC COMPONENT AND METHOD OF PRODUCING SAME

Figures 1A, 1B:
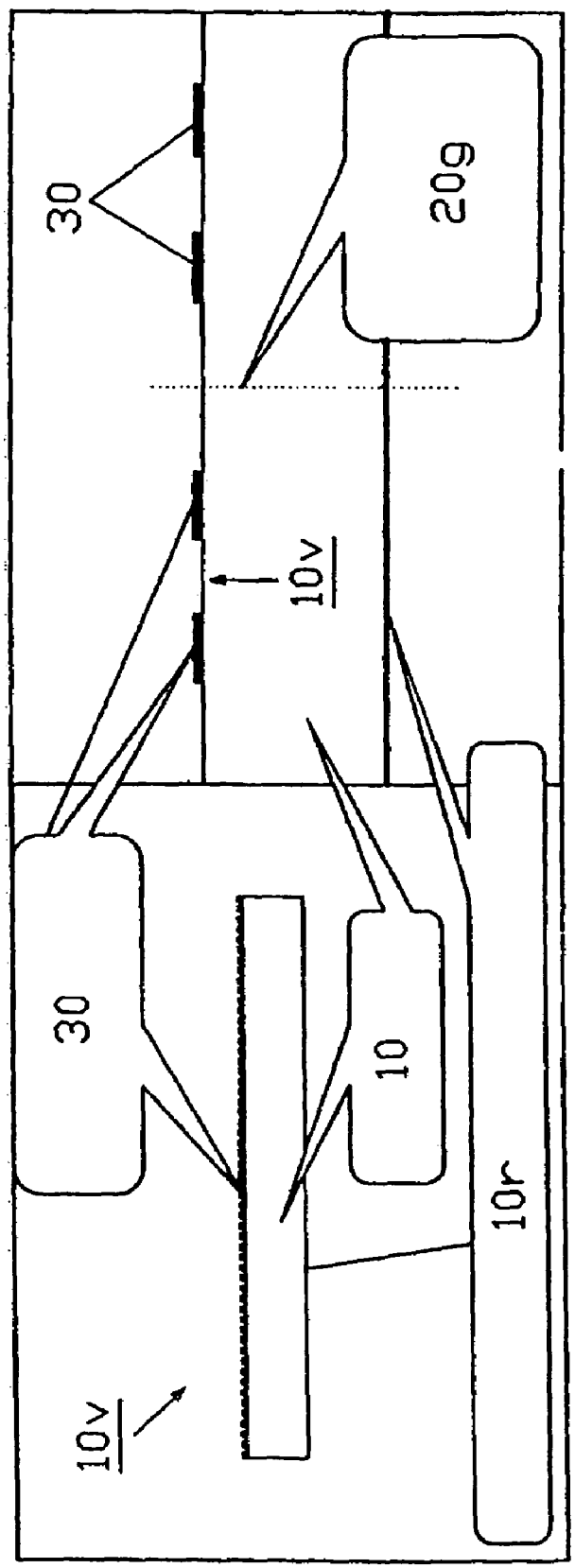

This application is a division of application Ser. No. 10/492,120 filed Oct. 11, 2004 and issued as U.S. Pat. No. 7,029,948, which is a 371 of a PCT/IB02/04130 filed Oct. 9, 2002, also claims priority under 35 U.S.C. § 119 to German Application No. 10149689.3 filed Oct. 9, 2001, by Michael Doescher.

The present invention relates generally to the technical field of fitting discrete or integrated devices into plastics packages of very small dimensions.

Specifically, the present invention relates to an electrical or electronic component having at least one discrete or integrated device formed from a wafer of semiconductive or insulating material in plate or disk form, the front face of which device has at least one overhanging and/or protruding and in particular ball-shaped or spherical electrode and is encapsulated by at least one front-face encapsulant, the side faces of which device are at least partly encapsulated by at least one side-face encapsulant, and the rear face of which device is encapsulated by at least one rear-face encapsulant.

The present invention further relates to a method of producing an electrical or electronic component wherein

[A] at least one overhanging and/or protruding contact is formed and/or thickened on the front face of a wafer of semiconductive or insulating material in plate or disk form,

[B.1] the rear face of the wafer is applied to a stretchable or extensible film,

[B.2] the wafer is divided into individual discrete or integrated devices,

[B.3] the film is stretched or extended,

[C.1 a] the front faces of the devices are coated with at least one front-face encapsulant and/or

[C.1.b] at least one side-face encapsulant is loaded from the area adjacent the front faces of the devices into the gaps which are formed between the individual devices when the film is stretched or extended,

[C.2.a] the rear faces of the devices are coated with at least one rear-face encapsulant and/or

[C.2.b] the side-face encapsulant is loaded from the area adjacent the rear faces of the devices into the gaps which are formed between the individual devices when the film is stretched or extended,

[D.1] at least one overhanging and/or protruding and in particular ball-shaped or spherical electrode is applied to each of the contacts, and

[E] the devices are so separated to form the individual components that the side faces of the individual components that are created by the division remain coated with the side-face encapsulant that was loaded into the gaps.

The encapsulation of discrete or integrated devices, and particularly silicon chips, with plastics material (so-called chip scale packaging or in other words packaging of devices at chip level) is widely known in the present technical field, as also is the sawing apart and measurement of discrete or integrated devices at wafer level.

An electrical or electronic component of the kind defined above and a method of producing the same of the kind defined above are disclosed in particular in U.S. Pat. No. 5,989,982. Reference is also made to other prior art relating to corresponding electrical or electronic components and methods of producing them in the form of JP 2000-124 164, U.S. Pat. No. 6,107,164 and WO 94/25987 A1.

However, what all the sets of subject matter disclosed in the above-mentioned prior art printed publications have in common is that their possible uses and applications are limited inasmuch as electrical contact is in each case made only with the front face of the device that is to be housed in the plastics package of very small dimensions. Also, none of the above prior art printed publications indicates a way in which the device can be enclosed by the plastics encapsulation on all sides in an efficient and inexpensive manner and one which produces a hermetic seal and is thus reliable.

Taking the disadvantages and inadequacies outlined above as a basis, it is an object of the invention to refine an electrical or electronic component of the kind defined above, and a method of producing the same of the kind defined above, in such a way that, with the aim of widening the possible uses and applications, electrical contact is not made solely with the front face of the device that is to be housed in the plastics package of very small dimensions, the intention at the same time being that the component should be enclosed by the plastics encapsulation on all sides in an efficient and inexpensive manner and one which produces a hermetic seal and is thus reliable.

This object is achieved by an electrical or electronic component having the features defined in claim 1 and by a method of producing the same having the features defined in claim 4. Advantageous embodiments and useful refinements of the present invention are defined in the respective sets of subclaims.

The teaching of the present invention thus provides a totally novel approach to so-called chip scale packaging, that is to say to the packaging of devices at chip level. In essence, this approach is based on the fact that the discrete or integrated devices, which in a manner essential to the invention may take the form of chips and in particular silicon chips, are provided on their front faces, preferably by electroplating or even by electroless deposition, with electrodes and in particular with so-called solder balls or solder spheres, and are then packed step by step into a plastics package by a succession of encapsulating, dividing and stretching or extending steps, in which case use is made of various composite materials.

The present invention is notable in particular for the fact that, as part of a simple, efficient and inexpensive chip scale packaging process in which, to improve their ruggedness over their lifetime, the chips are fitted into a plastics package of very small dimensions that encloses them on all sides (the dimensions of the package are defined simply by the minimum thickness of the plastics encapsulant and by the dimensions of the chip, the size of the package being only slightly larger than that of the chip), as well as being made "frontally" with the front face (or top face) of the chip, electrical contact is also made in this way with its rear face (or bottom face).

In this connection, there are also other preferred arrangements, such for example as the making of contact with so-called bond pads on both the front face (or top face) of the chip and also on its rear face (or bottom face) while at the same time the side faces of the chip are insulated against such contacts, which can readily be covered and comprised by the present invention, where necessary by new combinations and/or repetitions of the steps described for the method. When this is the case, the product directly produced by the present method, namely the electrical or electronic component, is always novel.

The man skilled in the art of semiconductor devices, and particularly in the art of wafer technology, will find it particularly valuable in this connection that no complicated and expensive handling is required for the individual packaged or unpackaged chips; throughout the whole of the processing by the method according to the present invention the chips can in fact remain combined into a wafer, which renders obsolete not only any complicated handling of individual products but also any pre-measurement of the chips which would conventionally take place at wafer level. What is more, it is possible to dispense with a so-called lead frame and a process associated with so-called bonding wires.

These and other aspects of the invention are apparent from and will be elucidated with reference to the embodiment described hereinafter.

Figures 14A, 14B:
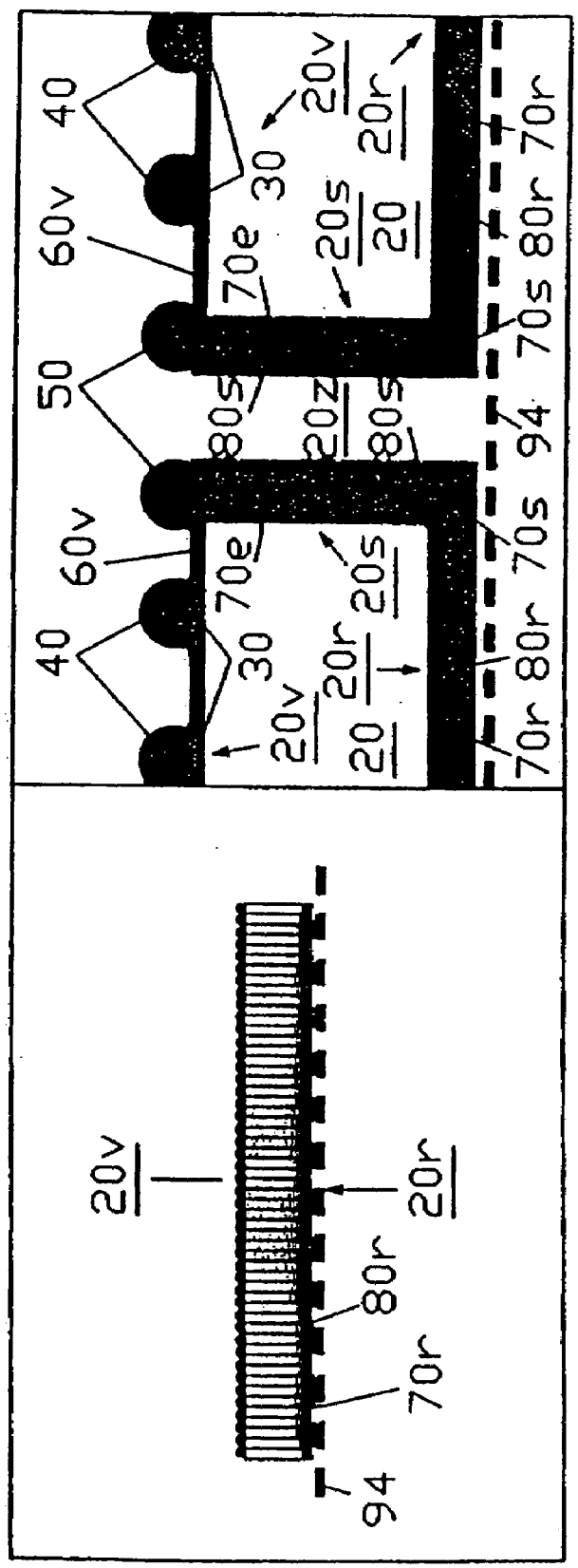
Figure 15:
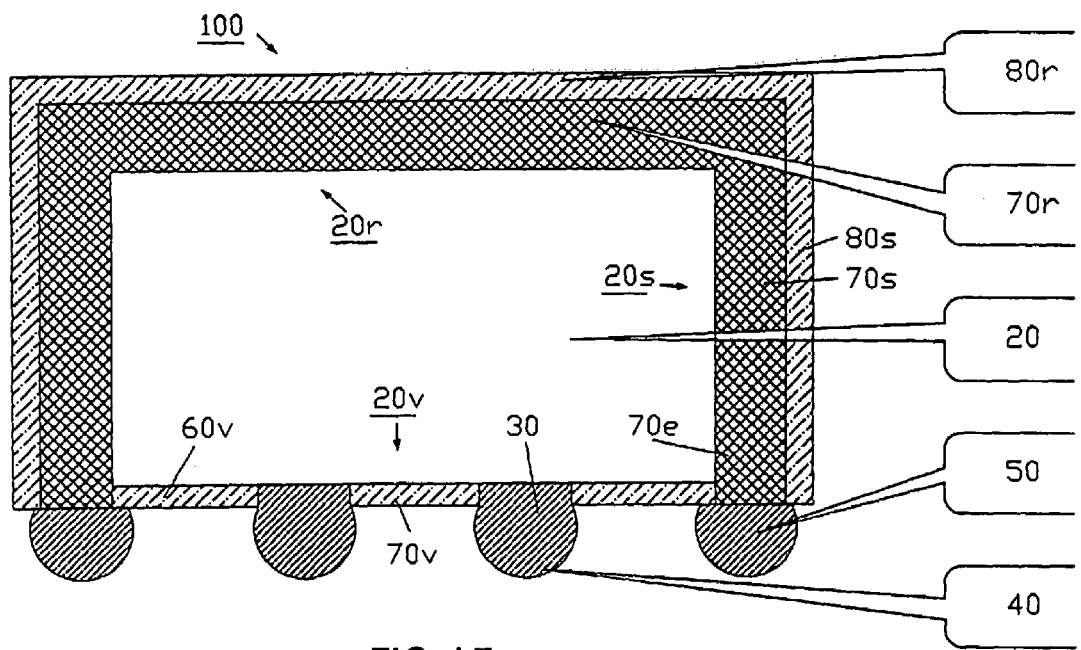
Figure 16C:
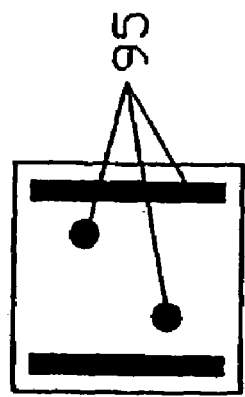
Figure 16B:
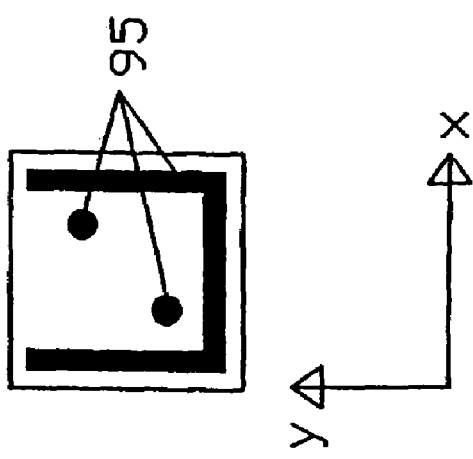
Figure 16A:
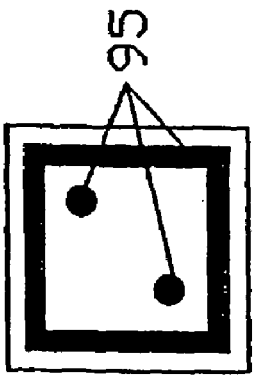

In the drawings:

FIGS. 1A to 14B are diagrammatic cross-sectional views of the various steps of the method when producing a novel electrical or electronic component according to the present invention, which views, to make the individual arrangements, elements or features clear and recognizable, are not to scale and comprise pairings of which the first halves (FIGS. 1A, 2A, 3A, 4A, 5A, 6A, 7A, 8A, 9A, 10A, 11A, 12A, 13A and 14A) are general arrangement views and the second halves (FIGS. 1B, 2B, 3B, 4B, 5B, 6B, 7B, 8B, 9B, 10B, 11B, 12B, 13B and 14B) are detail views;

FIG. 15 is a diagrammatic cross-sectional view of an embodiment of novel electrical or electronic component according to the present invention which is produced by the method steps shown in FIGS. 1A to 14B, which view, to make the individual arrangements, elements or features clear and recognizable, is not to scale, and FIG. 16 is a view from the rear of variants a), b) and c) of a chip having two front-face contacts which are shown by way of example.

Similar or identical arrangements, elements or features are given the same reference numerals in FIGS. 1A to 15.

For the embodiment of the present invention which is elucidated by reference to FIGS. 1A to 15, the various method steps for producing an electrical or electronic component 100 (i.e. for chip scale packaging with step by step encapsulation at wafer level) to the point where a finished end product (=electrical or electronic component 100; see FIG. 15) which has been encapsulated step by step in a plastics shell is obtained, are shown in FIGS. 1A to 14B.

As can be seen from FIGS. 1A and 1B, what is used as the starting material in this case is a so-called "silicon wafer", namely a substrate 10 of semiconductive material, in plate or disk form, which has been fully processed at chip level and preferably ground to a thin state (the boundary (20g) for the purposes of semiconductor technology between two chips is indicated by a dotted line in FIG. 1B) and which has, on its chip top or front face 10v, a plurality of contacts 30 in the form of so-called metal bond pads; the chip bottom or rear face 10r is metallized and electrical contact is made with it in the course of the planned sequence of events explained below.

As is shown in FIGS. 2A and 2B, the bond pads on the front face 10v of the silicon wafer 10 are then thickened into the form of projecting, protruding contacts 30 in method step [A] which comprises the so-called first thickening of the bond pads by electroplating or electroless deposition. This is done, in a manner essential to the invention, by processing the wafers by electroplating or electroless deposition, advantageously in one or more thickening steps, in such a way that there grow, on the bond pads situated on the front face 10v of the wafer, metal structures that are in particular of a columnar or at least mushroom shape and of a height which at least just exceeds the minimum thickness of the subsequent plastics encapsulation(s). The structures produced on the metal bond pads should usefully be of the same material as the subsequent "solder mushrooms" (see method steps [D.1] and [D.2] which are explained below by reference to FIGS. 13A and 13B).

In a manner essential to the invention, steps aimed at a so-called "redistribution" of the electrical connections to the chips may also be taken as early as in the course of method step [A]. In a redistribution of this kind, the structures produced on the metal bond pads, and also the subsequent "solder mushrooms", are not connected directly to the bond pads but are connected thereto via at least one electrically conductive and preferably metal connection (or "interconnection") which is recessed into the front face 10v of the wafer. Depending on the chip design, the technical function and the purpose for which the electrical or electronic components 100 according to the present invention are subsequently to be used or employed, interconnections of this kind may take the form of, say, conductive wires or conductive films, of copper for example.

As shown in FIGS. 3A and 3B, the next method step [B.1] now takes place, namely the application or "mounting" of the complete wafer 10 by its rear face 10r to a (first) stretchable or extensible film of plastics material 90 of the kind usually employed as a prerequisite for the division of the wafer 10 into individual discrete or integrated devices 20; this so-called FFC plastics film 90 (FFC=film frame carrier) has a self-adhesive action on its side adjacent the rear face 10r of wafer 10.

As can be seen from FIGS. 4A and 4B, after the rear face 10r of the wafer 10 has been applied to the plastics film 90, the front face 10v of the wafer 10 is coated with a front-face encapsulant 60v. However, in this case the process of coating the front face 10v of the wafer 10 with the front-face encapsulant 60v is independent of the application of the rear face 10r of the wafer 10 to the plastics film 90, i.e. the plastics film 90 need not be subjected yet to the first encapsulation process as shown in FIGS. 4A and 4B.

In this first encapsulation process shown in FIGS. 4A and 4B, the surface of the wafer is coated by one or more spin-coating procedures with the advantageously self-curing or U(ltra)V(iolet)-curing plastics encapsulant 60v, the degree of curing of which should preferably be sufficient not to allow the plastics encapsulant 60v on the front face to flow at room temperature; the final curing should usefully not take place until later in this case, to cause the edges then to flow together.

The thickness of the plastics encapsulant 60v on the front face is selected to be sufficient for the surface of the wafer to be completely covered. The bond pads which have been thickened by electroplating or electroless deposition may be partly or completely covered in this case, but do not have to be (in the view shown in FIG. 4B, unspecified residues 62 of the front-face encapsulant 60v can be seen on the second and fourth bond pad (reading from the left) which have been thickened by electroplating or electroless deposition).

Figures 5A, 5B:
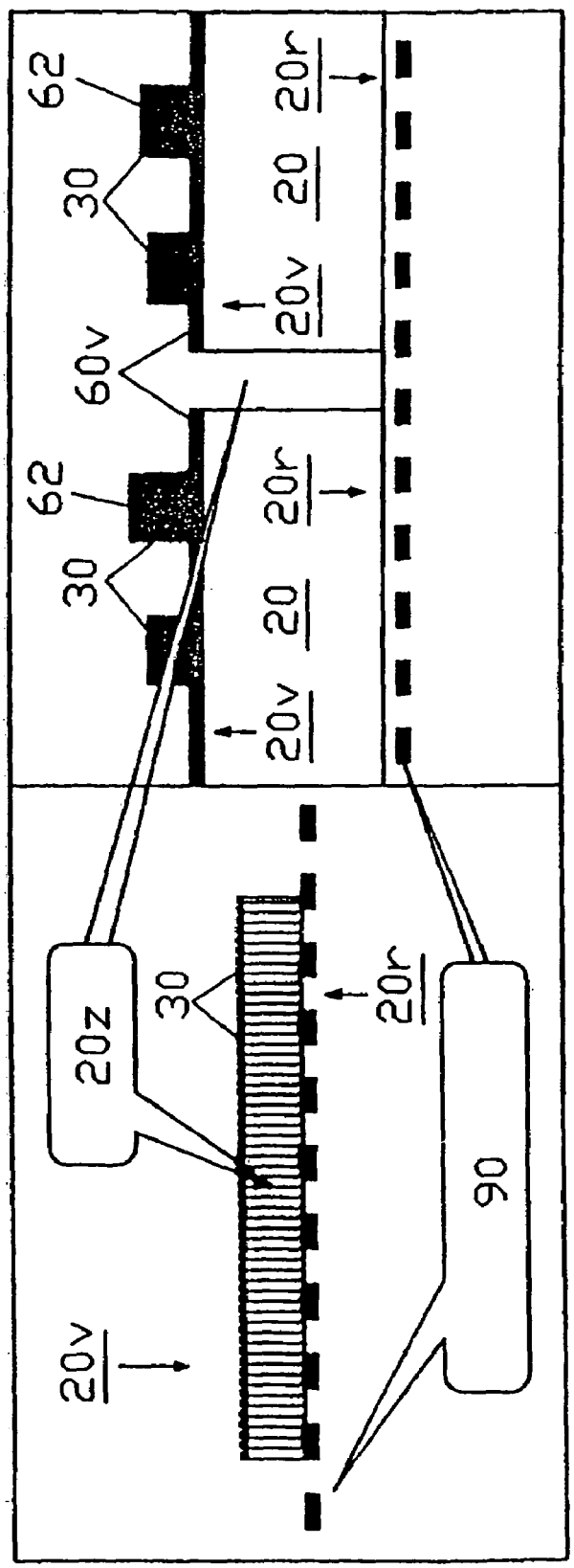

As can be seen from FIGS. 5A and 5B, the wafer 10 is then divided into individual discrete or integrated devices 20 in a method step [B.2]. This separation of the individual chips is performed by a first sawing process on the saw lines provided for the purpose, which are defined in the form of the boundary for semiconductor technology purposes 20g between the chips indicated by the dotted line in FIG. 1B. In a manner essential to the invention, this first sawing process may initially take place only in one direction and/or only on every second or third saw line, so that what then exists is essentially dies. The saw lines may preferably be recognized and stored by means of a pattern recognition system before the first encapsulating process (see FIGS. 4A and 4B).

As is further disclosed in FIGS. 5A and 5B, after the sawing the plastics film 90 is stretched or extended (=method step [B.3]). This causes the wafer too to be expanded or spread apart, which can advantageously be achieved by a procedure in which the circumference of the FFC frame of the plastics film 90 (the FFC=film frame carrier) is increased (on the so-called springform principle). When this is done the stretching or extension of the plastics film and hence of the wafer causes gaps 20z to form between the individual devices 20, specifically in the areas in which the saw cuts were made.

What are now shown in FIGS. 6A and 6B are the next steps [C.1a] and [C.1.b] of the method, which can be subsumed under the general designation of a second encapsulation process and which comprise, in essence, a side-face encapsulant 70s being loaded (=method step [C.1.b]) from the area adjacent the front faces 20v of the devices 20 into the gaps 20z which are formed between the individual devices 20 when the plastics film 90 is stretched or extended.

What is done in detail for this purpose is that in method step [C.1.a] the surface of the wafer is coated by means of one or more spin coating procedures with the further front-face encapsulant 70v, which is also advantageously self-curing or U(ltra)V(iolet)-curing but which differs from the "first" front-face encapsulant 60v (FIGS. 4A and 4B) in that it is formed from electrically conductive or electrically conducting material. Because this step serves only to fill the sawn trenches, the process which should preferably be used however is the following:

In method step [C.1.b], the gaps 20z which are formed between the individual devices 20 as "sawn trenches" could be filled with the side-face encapsulant 70s of electrically conducting or electrically conductive material, which is advantageously likewise self-curing or U(ltra)V(iolet)-curing, by injection from individual nozzles or preferably nozzles arranged in a comb layout. The gaps 20z produced by the sawing are filled in this case by moving the comb of nozzles laterally across the entire plane of the wafer during the injection process.

The electrically conductive front-face encapsulant 70v, but in particular the electrically conductive side-face encapsulant 70s, may for example be implemented in the form of a conductive chip adhesive; use may however also be made of other conductive plastics materials which are preferably better adapted to the plastics materials otherwise used for encapsulation.

By capillary action, the plastics substance 70s which is injected, whose viscosity is suitably selected, is drawn completely into the gaps 20z which are formed as saw lines between the individual devices 20; in this connection any cavities or air bubbles which could possibly be left should be prevented from occurring "at the bottom", i.e. in that area of the saw lines (=gaps 20z) which is adjacent the rear faces 20r of the devices 20, even though such cavities or air bubbles are not, in essence, critical because they can be filled in retrospectively in method step [C.2.b] which is detailed below (see FIGS. 8A and 8B).

The degree of curing of the electrically conductive plastics encapsulants 70v, 70s should be selected to be at least sufficient for them not to flow at room temperature (the final curing preferably does not takes place until a later stage of the method to cause the edges then to flow together). The bond pads which have been thickened by electroplating or electroless deposition may be partly or completely covered in the course of this but do not have to be; the height of the areas of plastics material which are produced in this way in the region of the saw lines should however be equal to or greater than the thickness of the plastics material 60v which was applied in the method step elucidated by reference to FIGS. 4A and 4B.

Figures 7A, 7B:
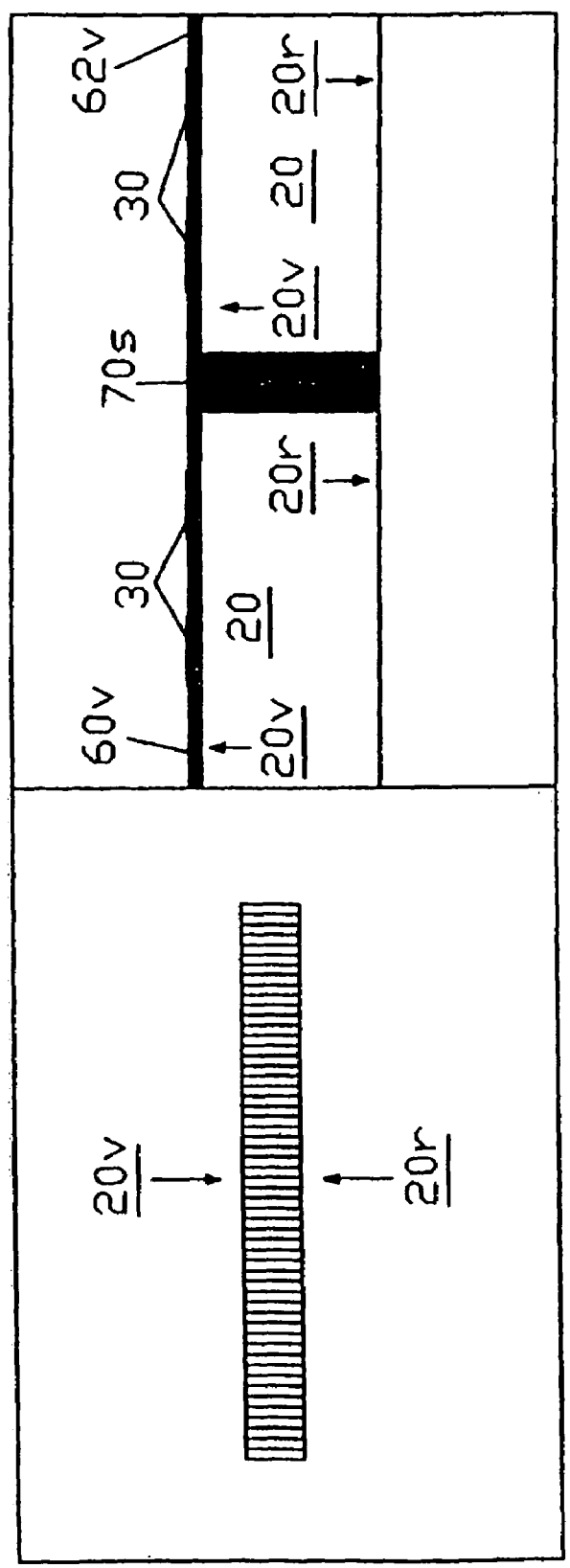

As shown in FIGS. 7A and 7B, the wafer and its devices 20 is then detached from the stretched or extended plastics film 90 and planarized, with the contacts 30 on the top or front face 20v included, in one or more preferably chemical-mechanical polishing steps. This produces a plane face from which neither the contacts 30 which have been thickened by electroplating or electroless deposition (see method step [A]) nor the front-face encapsulants 60v, 70v which have been applied to the front faces 20v of the devices 20 (see method step [C.1.a]) nor the side-face encapsulant 70s which has been loaded into the saw lines (=gaps 20z) (see method step [C.1.b]) project or protrude, and in which any short-circuits between the electrical contacts on the front face which may possibly have occurred in step 6a have been removed.

In this first planarization process, the front-face encapsulant 60v which was applied as part of the first encapsulating process (see FIGS. 4A and 4B) is also partially removed, but only to an extent that allows a thickness of the front-face encapsulant 60v which meets the specifications to be left on the bond pad face of the chips. What is achieved by the first planarization process is on the one hand that the wafer can be processed on its rear face in subsequent method steps without there being any problems with the handling, and in particular the mounting, of the wafer due to a rough front face, and on the other that the plastics encapsulation 60v, 70v on the bond pad face, i.e. on the front faces 20v of the devices 20, is given an exactly specifiable thickness.

As can be seen from FIGS. 8A and 8B, in the next method step [C.2.a] the rear faces 20r of devices 20 are coated with a rear-face encapsulant 70s; in a subsequent step of the method this layer of plastics material will be used to make electrical contact with the bottom or rear face 20r of the devices 20; in detail, the whole area of the bottom or rear face of the wafer is coated layer by layer with the advantageously self-curing or U(ltra)V(iolet)-curing plastics encapsulant 70r of electrically conductive material, preferably by one or more spin coating procedures.

In conjunction with this third encapsulation process, the advantageously self-curing or U(ltra)V(iolet)-curing plastics encapsulant of electrically conductive material is, in a method step [C.2.b] which preferably takes place in unison with method step [C.2.a], also loaded as a side-face encapsulant 70s, from the area adjacent the rear faces 20r of the devices 20 into the gaps 20z which are formed between the individual devices 20 when the plastics film 90 is stretched or extended; what this does is principally to fill any cavities or air bubbles which may possibly have been left "at the bottom", i.e. in the area of the saw lines (=gaps 20z) which is adjacent the rear faces 20r of the devices 20.

After the coating of the rear faces 20r of the devices 20 with the electrically conducting or electrically conductive rear-face encapsulant 70r (see method step [C.2.a] above) and after the loading of the electrically conductive or electrically conducting side-face encapsulant 70s into the gaps 20z (see method step [C.2.b] above), the rear faces 20r of the devices 20 which are coated with the electrically conducting or electrically conductive encapsulant 70r are applied in turn to a (second) stretchable or extensible plastics film 92 such as is used for normal sawing processes; what this means in other words is that the complete wafer is mounted in a method step [C.3] onto the (second) FFC plastics film 92 (FFC=film frame carrier), of which the face adjacent the rear faces 20r of the devices 20 is embodied so as to be self-adhesive or adhesive.

From what is shown in FIGS. 9A and 9B it is apparent that, by means of a second sawing process which then follows (=method step [C.4]) and by means of a second stretching or extending process which then follows (=method step [C.5]), the individual devices 20 in chip form, optionally also as cut dies, are again separated from one another, along the saw lines provided, in such a way that the side faces 20s of the individual devices 20 which are produced by the separation remain covered by the electrically conducting or electrically conductive side-face encapsulant 70s which was loaded into the gaps 20z (see method steps [C.1.b] and [C.2.b] above); hence no injury is caused to the lateral coverings 70s of the chips in the separating and stretching or extending process shown in FIGS. 9A and 9B, as can be seen from FIG. 9B, which shows the state which exists after the sawing and extending processes.

What are now shown in FIGS. 10A and 10B are the next steps [C.6.a] and [C.6.b] of the method, which can be subsumed under the general designation of a fourth encapsulation process and which comprise, in essence, a further side-face encapsulant 80s being loaded (=method step [C.6.b]) from the area adjacent the front faces 20v of the devices 20 into the gaps 20z which are formed between the individual devices 20 when the plastics film 92 is stretched or extended. This additional stretching or extension of the plastics film 92 is performed principally to ensure that the gaps 20z which are to be filled in method step [C.6.b] are each of an adequate width.

What now happens in detail is that in method step [C.6.a] the surface of the wafer is covered, by means of one or more further spin coating procedures, with the further front-face encapsulant 80v, which is likewise advantageously self-curing or U(ltra)V(iolet)-curing but which differs from the "second" front-face encapsulant 70v (see FIGS. 6A and 6B) in that it is formed from an electrically insulating material. Because this step serves only to fill the sawn trenches, the method employed should however preferably be the following:

In method step [C.6.b], the gaps 20z which were formed between the individual devices 20 as "sawn trenches" may be filled by injecting them with the side-face encapsulant 80s of electrically insulating material, which is advantageously also self-curing or U(ltra)V(iolet)-curing, by means of individual nozzles or preferably nozzles arranged in a comb layout. The gaps 20z produced by the sawing are filled when this is done by moving the comb of nozzles laterally across the entire plane of the wafer during the injection process.

The electrically insulating front-face encapsulant 80v, but in particular the electrically insulating side-face encapsulant 80s, may for example be implemented in the form of an insulating chip adhesive; use may however also be made of other insulating plastics materials which are preferably better adapted to the plastics materials otherwise used for encapsulation.

By capillary action, the plastics substance 80s which is injected, whose viscosity is suitably selected, is drawn completely into the gaps 20z which are formed as saw lines between the individual devices 20; in this connection any cavities or air bubbles which could possibly be left should be prevented from occurring "at the bottom", i.e. in that area of the saw lines (=gaps 20z) which is adjacent the rear faces 20r of the devices 20, even though such cavities or air bubbles are not, in essence, critical because they can be filled in retrospectively in method step [C.7.b] which is detailed below (see FIGS. 12A and 12B).

The degree of curing of the electrically insulating plastics encapsulants 80v, 80s should be selected to be at least sufficient for them not to flow at room temperature (the final curing preferably takes place at a later stage of the method to cause the edges then to flow together). The top or front faces 20v on the wafer which were planarized as shown in FIGS. 7A and 7B, including the bond pads which were thickened by electroplating or electroless deposition, may be partly or completely covered in the course of this but do not have to be; the height of the areas of plastics material which are produced in this way should however be equal to or greater than the thickness of the plastics material 60v which is applied in the method step elucidated by reference to FIGS. 4A and 4B (after the first planarization shown in FIGS. 7A and 7B).

As shown in FIGS. 11A and 11B, the wafer and its devices 20 is then detached from the stretched or extended plastics film 92 and planarized, with the contacts 30 on the top or front face 20v included, in one or more preferably chemical-mechanical polishing steps. This produces a plane face from which neither the contacts 30 which were thickened by electroplating or electroless deposition (see method step [A]), nor the front-face encapsulants 60v, 70v, 80v which were applied to the front faces 20v of the devices 20 (see method step [C.1.a] and method step [C.6.a]), nor the side-face encapsulants 70s, 80s which were loaded into the saw lines (=gaps 20z) (see method step [C.1.b] and method step [C.6.b]), project or protrude.

In this second planarization process, the front-face encapsulant 60v which was applied as part of the first encapsulating process (see FIGS. 4A and 4B) is also partially removed, but only to an extent that allows a thickness of the front-face encapsulant 60v which meets the specifications to be left on the bond pad face of the chips. What is achieved by the first planarization process is on the one hand that the wafer can be processed on its rear face in subsequent method steps without there being any problems with the handling, and in particular the mounting, of the wafer due to a rough front face, and on the other that the plastics encapsulation 60v, 70v, 80v on the bond pad face, i.e. on the front faces 20v of the devices 20, is given an exactly specifiable thickness; finally the second planarizing step ensures that the bond pad metallization which has been thickened by electroplating or electroless deposition (see method step [A] as shown in FIGS. 2A and 2B) is free of any plastics residues for further processing in the method steps [D.1] and [D.2] which are elucidated below by reference to FIGS. 13A and 13B and which comprise the so-called second thickening of the bond pads by electroplating or electroless deposition.

As can be seen from FIGS. 12A and 12B, in the next method step [C.7.a] the rear faces 20r of the devices 20 are coated with a further rear-face encapsulant 80r; in detail, the whole area of the bottom or rear face of the wafer is coated layer by layer with the advantageously self-curing or U(ltra)V(iolet)-curing plastics encapsulant 80r of electrically insulating material by one or more spin coating procedures.

In conjunction with this fifth encapsulation process, the advantageously self-curing or U(ltra)V(iolet)-curing plastics encapsulant of electrically insulating material can also be loaded as a side-face encapsulant 80s, from the area adjacent the rear faces 20r of the devices 20, into the gaps 20z which are formed between the individual devices 20 when the plastics film 92 is stretched or extended, this loading taking place in a method step [C.7.b] which preferably takes place in unison with method step [C.7.a]; what this does is principally to fill any cavities or air bubbles which may possibly have been left "at the bottom", i.e. in that area of the saw lines (=gaps 20z) which is adjacent the rear faces 20r of the devices 20.

Figures 13A, 13B:
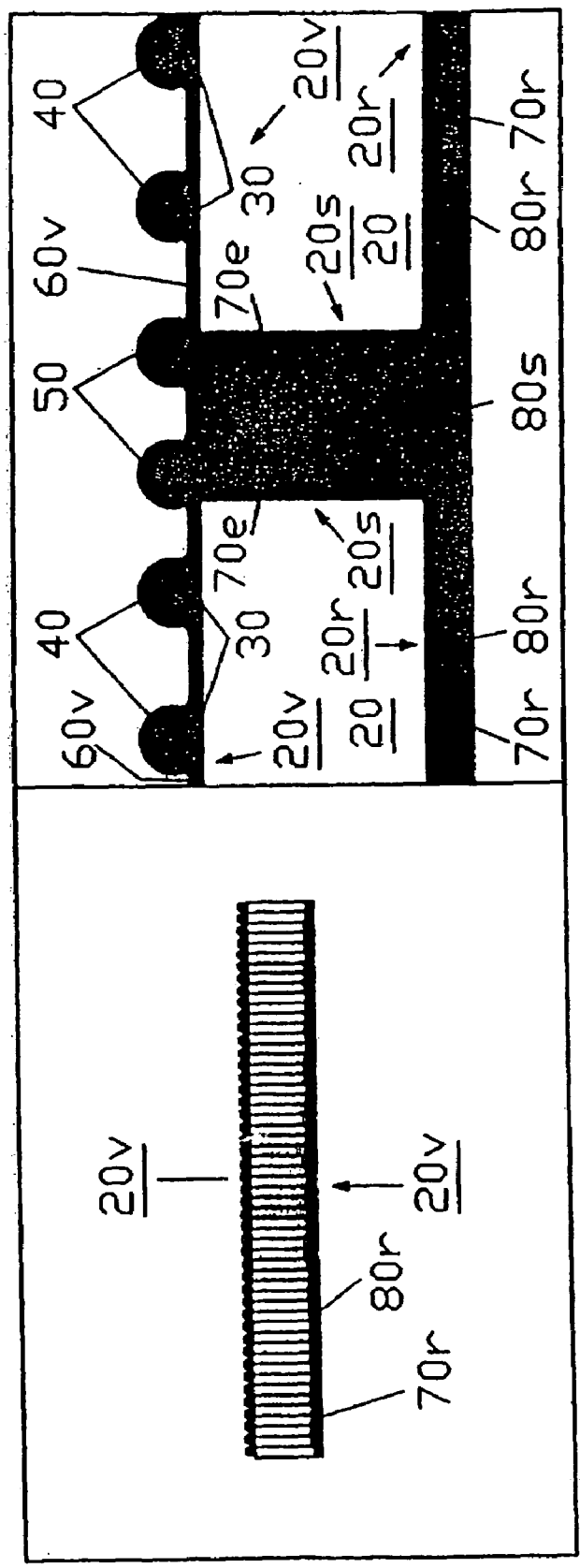

As can be seen from FIGS. 13A and 13B, ball-shaped or spherical projecting or protruding electrodes 40 are then applied to the contacts 30 in a method step [D.1] which comprises the second thickening of the bond pads by electroplating or electroless deposition. This is done in a manner essential to the invention by, in one or more thickening steps, processing the wafer by electroplating or electroless deposition in such a way that, on the bond pads which had already been thickened by electroplating or electroless deposition, the metal and in particular columnar or at least mushroom-shaped structures which were subsequently planarized (see FIGS. 7A and 7B), and which do not exceed the (total) thickness of the frontal plastics encapsulations 60v, 70v after this planarizing step, are thickened again.

Also, as part of this second thickening of the bond pads by electroplating or electroless deposition and before or during or after the application of the electrodes 40 to the contacts 30 (=method step [D.1]), ball-shaped or spherical projecting or protruding electrodes 50 which act as rear-face contacts are applied to that exposed end 70e of the electrically conducting or electrically conductive side-face encapsulant 70s which is adjacent the front face 20v of the device 20; this is done as part of a method step [D.2] in which growth thus takes place on the conductive plastics material 70s by electroplating or electroless deposition.

With respect to method steps [D.1] and [D.2], it is important that at least the material which is applied by electroplating or electroless deposition in this second thickening step, i.e. the electrodes 40, and also the electrodes 50 which act as rear-face contacts, should be solderable; for this purpose both the electrodes 40 and the electrodes 50 which act as rear-face contacts may, in a manner essential to the invention, already be in the form of solder balls. For this purpose it is advantageous if the structures which are applied in this second thickening step [D.1], [D.2] preferably grow isotropically, thus producing substantially spherical solder balls (comparable to so-called B(all)G(rid)A(rray) solder contacts).

Following on from this, the rear faces 20r of devices 20 which are coated with the electrically insulating rear-face encapsulant 80r are applied in turn to a (third) stretchable or extensible plastics film 94 such as is used for normal sawing processes; in other words, what this means is that the entire wafer is mounted on the (third) FFC plastics film 94 (FFC=film frame carrier) which, on its face adjacent the rear faces 20r of devices 20, is embodied so as to be self-adhesive or adhesive.

From what is shown in FIGS. 14A and 14B (=method step [E] comprising the singulation of devices 20 to produce individual components 100), it can be seen that by means of a third sawing process which then follows and by means of a third stretching or extending process which then follows that the individual devices 20 in chip form are again separated from one another along the saw lines provided for them in such a way that the side faces 20s of the individual devices 20 which are produced by the separation remain covered by the electrically insulating side-face encapsulant 80s which was loaded into the gaps 20z (see method steps [C.6.b] and [C.7.b] above); hence no injury is caused to the lateral coverings 80s of the chips in the separating and stretching or extending process shown in FIGS. 14A and 14B, as can be seen from FIG. 14B, which shows the state which exists after the sawing and extending processes.

The devices 20 combined into the wafer have now been enclosed on all sides by the different plastics encapsulants 60v, 70v, 80v, 70s, 80s, 70r, 80r and can finally be subjected, in a manner essential to the invention, to an optional final conditioning, such, say, as a final tempering stage, to achieve a final cross-linking of the plastics encapsulants 60v, 70v, 80v, 70s, 80s, 70r, 80r.

This tempering process is intended to produce a sufficiently good seal, against ambient moisture for example, and this being the case the tempering stage may take place even before the application of electrodes 40 and 50 to contacts 30 and 70e respectively (=method steps [D.1] and [D.2]) comprising the second thickening by electroplating or electroless deposition of the bond pads, see FIGS. 13A and 13B) or directly after the application of electrodes 40 and 50 to contacts 30 and 70e respectively (=method steps [D.1] and [D.2]) comprising the second thickening by electroplating or electroless deposition of the bond pads, see FIGS. 13A and 13B).

A final measuring step may take place in a manner essential to the invention either separately from this or in conjunction therewith.

Shown in FIG. 15 is the new product produced directly by the method shown in FIGS. 1A to 14B, namely an electrical or electronic component 100. This electrical or electronic component 100 contains a discrete or integrated device 20 (=a silicon chip) which is formed from a wafer 10 of semiconductive material (=silicon) in plate or disk form and whose front face 20v has two centrally arranged projecting or protruding ball-shaped or spherical electrodes 40 in the form of bond pads which have already been electroplated to be solderable.

The front face 20v of device 20 is not only covered by the front-face encapsulant 60v but also has the thin, electrically conductive front-face encapsulant 70v. On the side faces 20s of device 20, the side-face encapsulant 70s formed from electrically conductive material is encapsulated by the side-face encapsulant 80s formed from electrically insulating material.

In the same way, on the rear face 20r of device 20 the rear-face encapsulant 70r formed from electrically conductive material is encapsulated by the rear-face encapsulant 80r formed from electrically insulating material, this being done in such a way that both the electrically conductive side-face encapsulant 70s and also the electrically conductive rear-face encapsulant 70r are connected together as layers, which means that as well as with the front face (or top face) of the chip, electrically conductive contact is also made "frontally" with its rear face (or bottom face), by means of the connected layers of plastics material 70r, 70s; the electrically insulating layers of plastics material 80r, 80s are likewise connected together as layers and because of this the electrical contact with the rear face that is made by means of the interconnected conductive layers of plastics material 70r, 70s is screened off and electrically insulated from the outside of the package.

To produce the widening of possible uses and applications under the present invention that is aimed at with the electrical "rear-face contact", it is therefore not only the front face 20v of the device 20 housed in the plastics encapsulation 60v, 70v, 70s, 80s, 70r, 80r of very small dimensions with which contact is made in the electrical or electronic component 100 shown in FIG. 15 but also the rear face 20r; to allow electrical connections to be made, a projecting or protruding ball-shaped or spherical electrode 50, which has already been electroplated to be solderable and which acts as a rear-face contact, is arranged at the edge at each of those exposed ends 70e of the electrically conducting side-face encapsulant 70s which are adjacent the front face 20v of device 20.

In FIG. 15, the finished novel end product 100 with its concealed or "buried" rear-face metallization is shown in the "overhead" position in which it can be mounted on, for example, printed-circuit boards; if in this connection an estimate is to be made of the contact resistance of this concealed or "buried" contact-equipped rear-face metallization, then for, for example, a silicon chip having a thickness of approximately 100 μm and having an edge length of approximately 200 μm by approximately 200 μm, the conductive plastics layer 70r, 70s can be assumed to be approximately 200 μm thick and can be assumed to have a resistivity typical of chip adhesives of approximately 0.1 mΩ cm; contact can then be made with the bottom or rear face 20r via a contact resistance of the order of approximately 100 mΩ relative to the top or front face 20v; it is however also conceivable for plastics materials 70r, 70s of higher conductivity, i.e. of lower resistivity, to be used.

Before they are finally fitted, to a printed-circuit board say, the end products 100 can be separated into single units after the film 94 has been extended (see FIGS. 14A and 14B) and wrapped to form packs for transport such as reels or bars for example. The products, having been packed into packages which are as small as possible, can be made use of on the end customer's premises by "flip-chip mounting", preferably in reflow soldering processes.

FIG. 16 is a diagrammatic view showing that it can be determined by the sawing process 5B whether the rear-face contact is to be arranged (a) all round (by cutting in the x and y directions on every saw line), or (b) on three sides (by cutting in the x direction only on every second saw line but in the y direction on every saw line, or (c) on two sides (by cutting only in the y direction but on every saw line in this case).

The selection of the "footprint" which is set up in this way will have major repercussions for the customer and there is a great deal of flexibility as to what can be selected. This being the case, the examples mentioned represent only one possible selection.

LIST OF REFERENCE NUMERALS

100 Component
10 Wafer
10r Rear face of wafer 10
10v Front face of wafer 10
20 Device
20g Boundary for the purposes of semiconductor technology between two devices 20
20r Rear face of device 20
20s Side face of device 20
20v Front face of device 20
20z Gap between two individual devices 20
30 Contact
40 Electrode
50 Electrode acting as rear-face contact
60v Front-face encapsulant
62 Unspecified residues of front-face encapsulant 60v
70e Exposed end of electrically conducting or electrically conductive side-face encapsulant 70s
70r Electrically conducting or electrically conductive rear-face encapsulant
70s Electrically conducting or electrically conductive side-face encapsulant
70v Electrically conducting or electrically conductive front-face encapsulant
80r Electrically insulating rear-face encapsulant
80s Electrically insulating side-face encapsulant
80v Electrically insulating front-face encapsulant
90 (First) film
92 (Second) film
94 (Third) film

The invention claimed is:

1. An electrical or electronic component, having at least one discrete or integrated device formed from a substrate, the front face of said device has at least one protruding electrode and is encapsulated by at least one front-face encapsulant, the side faces of said device are at least partly encapsulated by at least one side-face encapsulant, and the rear face of which device is encapsulated by at least one rear-face encapsulant, wherein both the side-face encapsulant and the rear-face encapsulant are formed at least partly of layers, but with a connection between at least parts of layers, of electrically conductive material.

2. A component as recited in claim 1, wherein the at least one protruding electrode which acts as a rear-face contact is arranged at the exposed end of the electrically conductive side-face encapsulant adjacent the front face of the device.

3. A component as recited in claim 1, wherein the side-face encapsulant formed from electrically conductive material is encapsulated by side-face encapsulant formed from electrically insulating material and the rear-face encapsulant formed from electrically conductive material is encapsulated by rear-face encapsulant formed from electrically insulating material.

4. The component as recited in claim 1, wherein the protruding electrode is ball-shaped or spherical.

5. The component as recited in claim 1, wherein the substrate is selected from at least one of the following: semiconductor wafer, plate of insulating material, or disk of insulating material.

* * * * *